United States Patent [19]

Soejima

[11] Patent Number: 5,644,534
[45] Date of Patent: Jul. 1, 1997

[54] VOLTAGE BOOSTER CIRCUIT WITH PLURAL BOOSTER UNITS HAVING OUTPUTS CONNECTED IN COMMON

[75] Inventor: Kouta Soejima, Tokyo, Japan

[73] Assignee: Macronix International Co., Ltd., Hsin-chu, Taiwan

[21] Appl. No.: 570,682

[22] Filed: Dec. 11, 1995

[30] Foreign Application Priority Data

Dec. 27, 1994 [JP] Japan .................................. 6-336937
Nov. 30, 1995 [JP] Japan .................................. 7-312566

[51] Int. Cl.$^6$ ............................................. G11C 7/00
[52] U.S. Cl. ..................... 365/185.23; 365/189.09; 365/149
[58] Field of Search .................... 365/189.09, 149, 365/185.23; 327/535, 536, 537, 534, 589

[56] References Cited

U.S. PATENT DOCUMENTS

| | | | |
|---|---|---|---|
| 4,964,082 | 10/1990 | Sato et al. | 365/189.09 |
| 5,301,097 | 4/1994 | McDaniel. | |
| 5,394,372 | 2/1995 | Tanaka et al. | 365/189.09 |
| 5,422,590 | 6/1995 | Coffman et al. | 365/189.09 |
| 5,489,870 | 2/1996 | Arakawa | 327/536 |

FOREIGN PATENT DOCUMENTS

| | | |
|---|---|---|
| 61-032457 | 2/1986 | Japan . |
| 6-105538 | 4/1994 | Japan . |
| 7-194098 | 7/1995 | Japan . |

*Primary Examiner*—David C. Nelms
*Assistant Examiner*—Vu A. Le
*Attorney, Agent, or Firm*—Wilson Sonsini Goodrich & Rosati

[57] ABSTRACT

A booster circuit is provided with first and second booster circuit sections, which have the same construction and each of which is provided with capacitors and transistors for controlling the gate voltage of each of the final stage output transistor. The output terminals of the first and second booster circuit sections are connected to each other. Input pulses F1 to F4 are inputted to positions of first and second booster circuit sections, respectively. Input positions of F2 are replaced with those of F4 between the first and second raising circuit sections. Likewise, input positions of F1 are replaced with those of F3 therebetween. As a result, the first and second booster circuit sections operate, while having phases opposite each other. The booster circuit thus provides less voltage loss, smoother output voltage and a higher voltage raising capability.

8 Claims, 5 Drawing Sheets

VOLTAGE BOOSTER CIRCUIT WITH PLURAL BOOSTER UNITS HAVING OUTPUTS CONNECTED IN COMMON

BACKGROUND OF THE INVENTION

1. Field of the Invention

The present invention relates to a booster circuit for obtaining a voltage higher than the power source voltage or a voltage lower than the ground potential, and more particularly to a booster circuit provided in a semiconductor chip.

2. Description of the Related Art

A semiconductor memory, e.g. a flash EEPROM (flash electrically erasable programmable read only memory) employs a voltage higher than the power source voltage or a voltage lower than the ground potential to write data into or erase data from the memory cells. FIG. 1 is a block diagram showing a write circuit of a flash EEPROM. The high voltage generated by a booster circuit 1 is fed to a data input section 2, a column decoder 3 and a row decoder 4, and data is written into memory cell 5 by injecting channel hot electrons into the floating gates.

FIG. 2A shows a conventional booster circuit, and FIG. 2B clock pulses for controlling this booster circuit. As FIG. 2B shows, to generate a high voltage within a short time, the circuit is controlled by four clock pulses. The clock pulses differ from each other in timing to prevent a decrease in voltage raising efficiency. As FIG. 2A shows, a plurality of booster units (e.g. T1, T2, C1 and C2), each consisting of first and second transistors and first and second capacitors, are connected in series. A switch block consists of a switching transistor T9 which has one current terminal connected to the output terminal of the final-stage booster unit and the other current terminal connected to the voltage output node. The gate of the transistor T9 is connected to the gate of the second transistor of the final-stage booster unit, to one terminal of the second capacitor, and to one of the current terminals of the transistor T9 itself. The aim of this arrangement is to (1) operate the final-stage booster unit and the transistor T9 in correspondence with each other; (2) to apply a high drive voltage to the gate of the transistor T9 so that sufficiently boosted current can flow; and (3) to prevent current backflow.

As FIG. 2A shows, the booster circuit has a plurality of booster sections. The booster sections are identical in structure and operation. Therefore, the operation of the first booster section only will be explained with reference to FIG. 2C, which shows the waveform of the voltage that the first booster section generates in the initial phase of its operation. As seen from FIG. 2C, the node A is charged to voltage $V_{CC}$ in the period (1); a current flows from the node A to the node D in the periods (2), (4) and (6); a high voltage is generated at the node D in the periods (3) and (5).

As can be seen from the above, the conventional booster circuit has a transistor T9 through which a current is output. The transistor T9 is a diode-connection transistor, in which a gate and a drain are directly connected to avoid backflow of the output current $V_{OUT}$. The voltage $V_{OUT}$ is thus lower than the voltage generated at node L by the threshold voltage of the transistor T9, that is, by the voltage between the drain and the source. The higher the output voltage $V_{OUT}$, the higher the threshold voltage of the transistor T9, and the greater the voltage loss at the transistor. Hence, the boosting ability of the circuit decreases as the rise of the output voltage. Also, the conventional booster circuit generates a high voltage only once during a certain period of one cycle of the input clock pulse. That is, high voltage and not-high voltage are generated alternately. If the booster circuit has a small output capacity, the output voltage $V_{OUT}$ is a pulsating one. To render the voltage $V_{OUT}$ non-pulsating, a smoothing capacitor may be provided at the output. A smoothing capacitor, if used, deteriorates the integration density of the memory.

SUMMARY OF THE INVENTION

It is the first object of the present invention to provide a booster circuit which can ensure stabler output than the conventional one. It is the second object of the present invention to provide a booster circuit which is the modification of the conventional booster circuit to overcome shortcomings caused by the diode-connection switch blocks.

In order to achieve the above object, according to one aspect of the present invention, there is provided a booster circuit comprising: (a) first and second circuit sections each having a voltage input section and a voltage output section, the first and second circuit sections each comprising: a booster block having a plurality of booster units each having an input terminal and an output terminal, the booster units being arranged in series between the voltage input section and the voltage output section by connecting the input terminals and the output terminal between adjacent booster units; and an output switch block arranged between an output terminal of a final-stage booster unit of the booster block, and the voltage output section; and (b) a voltage output node for connecting the voltage output sections of the first and second circuit sections in common each other, wherein the output switch blocks of the first and second circuit sections are opened and closed with phases thereof opposite each other.

According to another aspect of the present invention, there is provided a booster circuit having a first booster circuit section and a second booster circuit section which have the same structure, each of the first and second booster circuit sections comprising: a plurality of first MOS transistors, the first MOS transistors each having a gate terminal and two current terminals and connected to one another in series; a plurality of second MOS transistors, the second MOS transistors each having a gate terminal and two current terminals, first one of the current terminals of each second MOS transistor connected to one of the current terminals of the first MOS transistor, second one of the current terminals of each second MOS transistor connected to the gate of the first MOS transistor, the gate terminal, excluding a case of a gate terminal of a second MOS transistor in a final stage, connected to the second one of the current terminals of the first MOS transistor, the gate terminal of the second MOS transistor in a final stage connected to a final node between first MOS transistors of another booster circuit section; a plurality of first capacitors each having one terminal connected to the gate of each first MOS transistor; and a plurality of second capacitors each having one terminal connected to a node between the first MOS transistors, wherein clock pulses are inputted to second terminals of the first and second capacitors, the second terminals of the first and second capacitors of the first booster circuit section and the second terminals of the first and second capacitors of the second booster circuit section being terminals which correspond to each other and which are supplied with clock pulses opposite each other in phase.

Four kinds of input pulses F2 and F4, and F1 and F3 are inputted to positions of the first and second booster circuit sections, respectively. Input positions of F2 are replaced with those of F4 between the first and second booster circuit sections. Likewise, positions of F1 are replaced with those of F3 therebetween. As a result, the first and second booster circuit sections operate in opposite phases to each other. Since the final stage transistors are not diode-connection transistors, voltage drop by a threshold voltage of MOS transistors does not occur.

In the booster circuit of the present invention, high voltage is outputted twice per cycle. Specifically, it is outputted first from the first booster circuit section and second from the second booster circuit section. When boosted voltage is applied from one of the booster circuit sections to the voltage output node, the other booster circuit section is designed to prevent current backflow, thus causing no problem.

With the use of the switch blocks of the booster circuit of the present invention, it is made possible to:

(1) obtain boosted voltage from the first and second booster circuit sections which operate in phases opposite each other;

(2) ensure high gate voltage, i.e. high drive voltage since the gate voltage of the fourth transistor of one of the booster circuit sections is derived from the output terminal of the final-stage booster unit of the other booster circuit section;

(3) prevent voltage from dropping by a threshold voltage of transistors since the switch blocks are not diode-connection transistors; and (4) naturally avoid current backflow.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 3A:
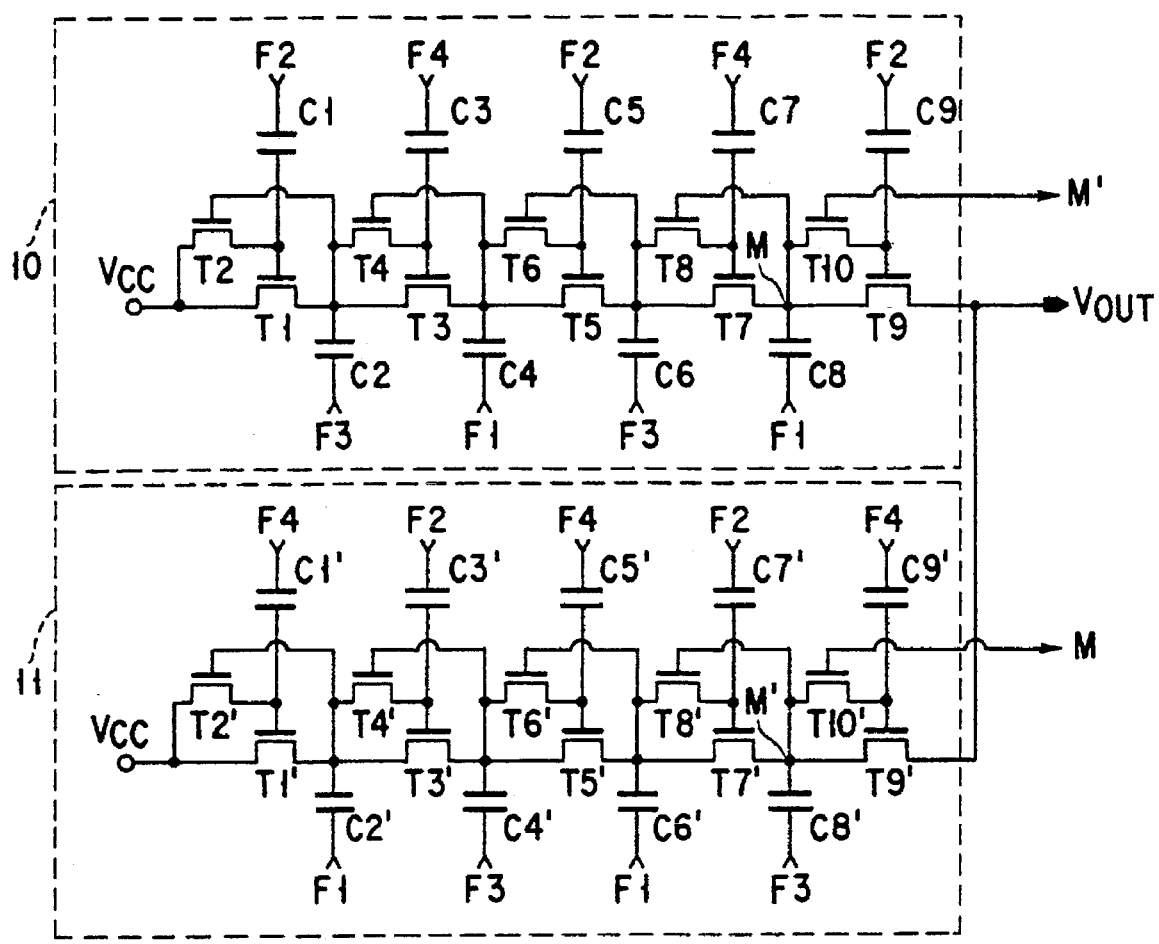
FIG. 3A illustrates a booster circuit for generating positive voltage according to the first embodiment of the present invention.

Embodiments of the present invention will now be described. FIG. 3A shows a booster circuit for generating a positive voltage according to the first embodiment of the present invention. Transistors T1, T3, T5, T7 and T9, which are connected in series, are n-MOSFETs. The drain of the transistor T1 is connected to the power source $V_{CC}$ of 5 V, and its source is connected to the drain of the next stage transistor T3. The gate of the transistor T1 is connected to a capacitor C1 and to the source of the transistor T2. The drain of the transistor T2 is connected to the power source VCC, and its gate is connected to a capacitor C2 and the drain of the transistor T4. The transistors T4–T9 as well as capacitors C3–C9 are connected in the same manner, thus making up a first booster circuit section 10. The circuit section 10 has a transistor T10 and the capacitor C9 in addition to the elements of the conventional booster circuit 6.

A second booster circuit section 11 has the same structure as that of the first booster circuit section 10. The gate of the transistor T10 of the first booster circuit section 10 is connected to a node M' of the second booster circuit section 11, that is, to the final node of a series of transistors T1', T3', T5', T7' and T9'. The gate of transistor T10' of the second booster circuit section 11 is connected to a node M of the first booster circuit section 10, that is, to the final node of a series of the transistors T1, T3, T5, T7 and T9. Additionally, outputs $V_{OUT}$ of the first and second booster circuit sections 10 and 11 are connected to each other.

As can be seen from the above, the first and second booster circuit sections 10 and 11 have a structure which is a slight modification of that of the conventional circuit. Therefore, the booster circuit of the present invention can be easily manufactured by slightly modifying the mask pattern of the conventional semiconductor booster circuit. The capacitors C2, C4, C6 and C8 occupy most of the area of the conventional raising circuit. If the total area occupied by the capacitors C2, C4, C6 and C8, C2', C4', C6' and C8' of the booster circuit of the present invention is made equal to that of the capacitors C2, C4, C6 and C8 of the conventional circuit, the output current of the present invention is the same in amount as that of the conventional circuit. Thus, even with this modification, the area does not greatly increase.

Figure 1:
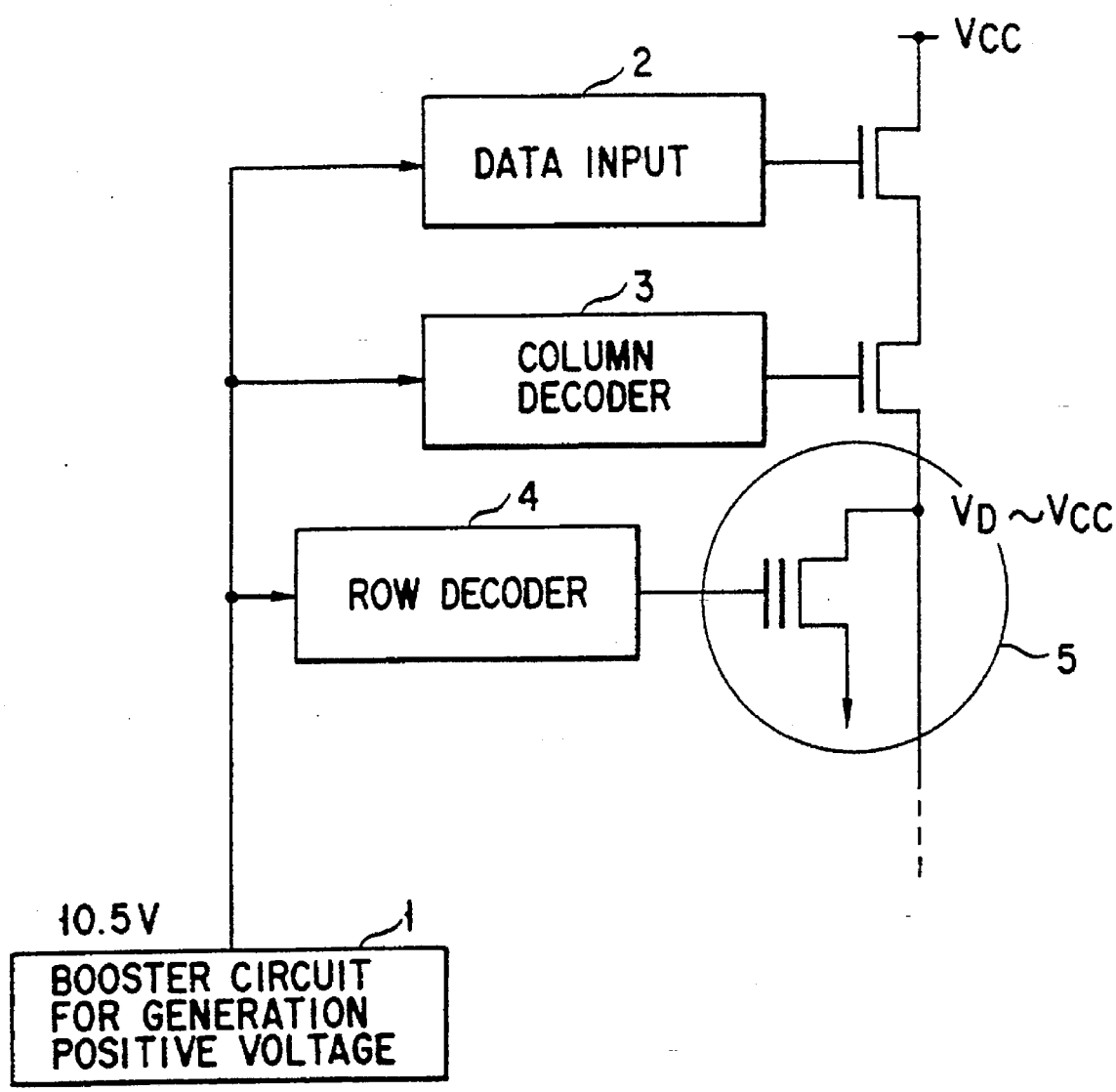
FIG. 1 is a block diagram showing a write circuit of a flash EEPROM.
Figure 2A:
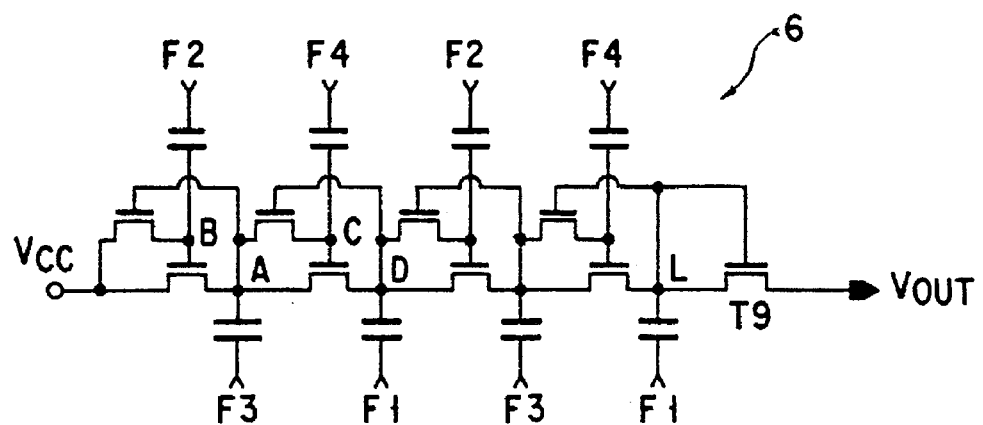
FIG. 2A illustrates a conventional booster circuit.
Figure 2B:
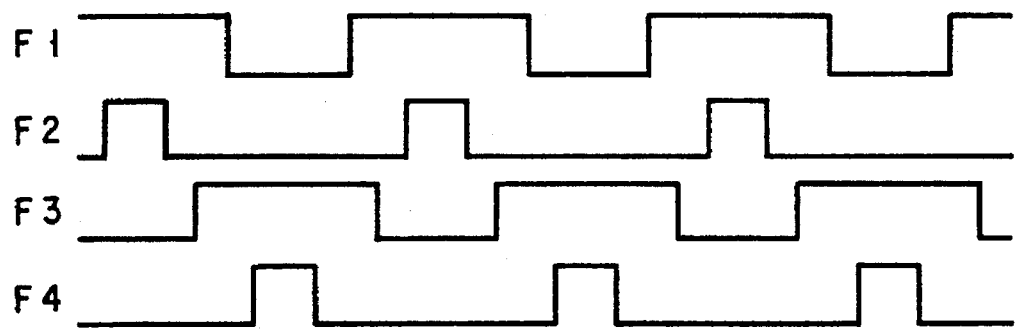
FIG. 2B illustrates clock pulses for controlling the booster circuit of FIG. 2A.
Figure 2C:
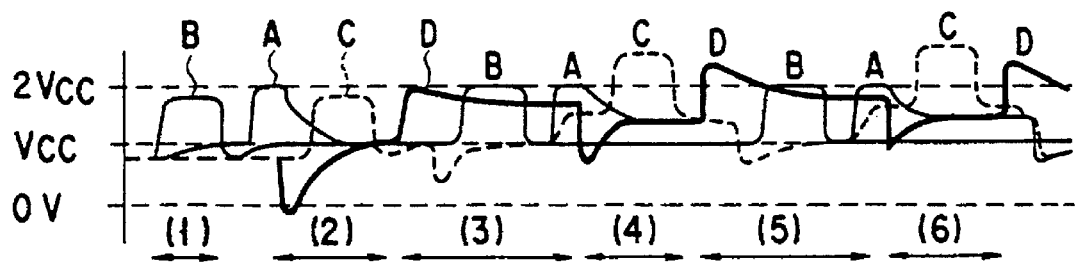
FIG. 2C illustrates waveforms indicating voltages at nodes in the initial operation.
Figure 3B:
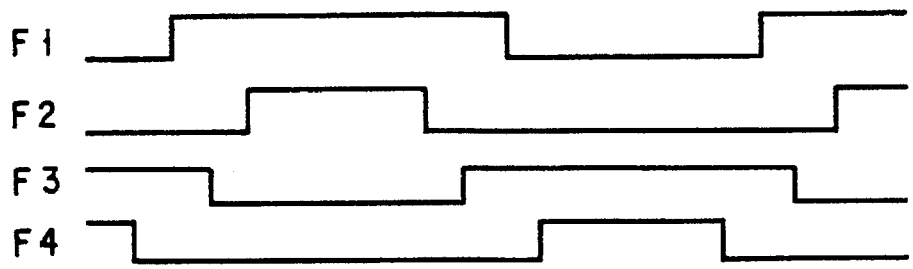
FIG. 3B illustrates clock pulses for controlling the circuit of FIG. 3A.

Next, the operation of the booster circuit of the present invention will be described. FIG. 3B illustrates clock pulses F1–F4 for controlling the booster circuit of the present invention. Waveforms of these clock pulses F1–F4 are identical with those of the conventional pulses (see FIG. 2B). Thus, a conventional clock pulse generation circuit can be used in the present invention.

The clock pulse F1 is inputted to one terminal of each of the capacitors C4, C8, C2' and C6', and F2 is inputted to one terminal of each of the capacitors C1, C5, C9, C3' and C7'. F3 is inputted to one terminal of each of the capacitors C2, C6, C4' and C8', and F4 is inputted to one terminal of each of the capacitors C3, C7, C1', C5' and C9'. Since the first and second booster circuit sections 10 and 11 have phases opposed to each other, they generate output voltage more smoothly than the conventional circuit.

The reason is as follows. In the circuit of FIG. 3A, the potential of the $V_{OUT}$ rises the moment that the F1 and F3 become high, and it drops in response to the output current during the remaining period. Consequently, the potential of the $V_{OUT}$ repeats rise and drop twice in one cycle. On the contrary, if only the two booster circuit sections having the same phase are connected to the $V_{OUT}$, the potential of the $V_{OUT}$ rises and falls only once per cycle. In this case, the drop period is twice as long as that of the circuit shown in FIG. 3A and the amount of voltage drop is almost twice as much as that of the circuit in FIG. 3A. Then, to recover from the drop level, voltage is also required to rise twice as much as that of FIG. 3A. In short, the circuit shown in FIG. 3A is designed to decrease the amount in the fall and rise of a voltage by operating two booster circuit sections having opposite phases, and to thereby obtain a smoother output voltage.

As can be seen from FIG. 3A, unlike the conventional circuit, the transistor T9 is not a diode-connection transistor. In the first booster circuit section 10, therefore, a voltage higher than a voltage at the node M is generated at the capacitor C9 by the input from the node M' of the opposed-phased second circuit section 11, the transistor T10 and the capacitor 9. The generated voltage is applied to the gate of the transistor T9, thereby allowing the output $V_{OUT}$ to have the same potential as that at the node M. Likewise, in the second circuit 11, the output $V_{OUT}$ has the same potential as that at the node M'.

Figure 4A:
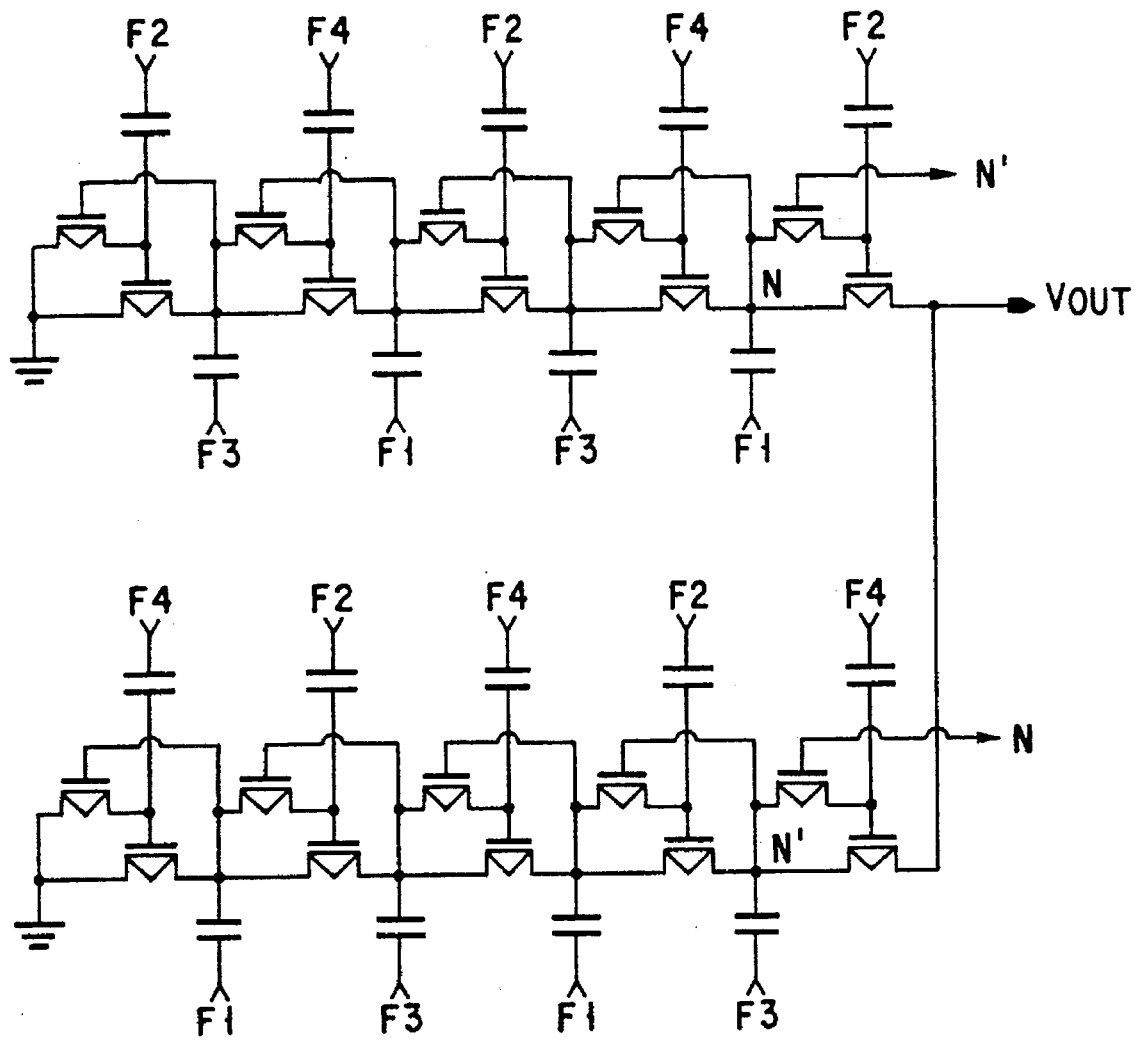
FIG. 4A illustrates a booster circuit according to the second embodiment of the present invention.

FIG. 4A illustrates a booster circuit according to the second embodiment of the present invention. It comprises p-MOSFETs in place of n-MOSFETs of the booster circuit shown in FIG. 3, and it generates a negative voltage.

Generally, a p-MOS transistor is greater than an n-MOS transistor in the effect of a threshold voltage and a substrate bias voltage. Due to this, according to the conventional booster circuit, voltage drop in the final stage diode-connected transistor of a booster circuit section constituted by n-MOS transistors is greater than that of a booster circuit section constituted by p-MOS transistors. In the booster circuit of the present invention, by contrast, voltage drop in the final stage transistors can be prevented and the booster circuit constituted by p-MOS transistors can produce the above-mentioned effect greater than the circuit constituted by n-MOS transistors.

Figure 4B:
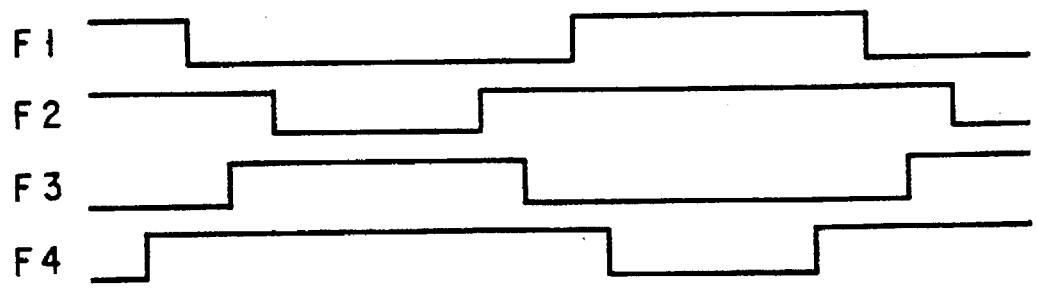
FIG. 4B illustrates clock pulses for controlling the circuit of FIG. 4A.

Negative voltage generated by such a circuit is used for, e.g., erasing data which is written into memory cells of a flash memory. FIG. 4B shows clock pulses for controlling the circuit of FIG. 4A. The clock pulses are identical with those of FIG. 3B except that their phases are opposite those of FIG. 3B.

The present invention, which has been made by slightly modifying the conventional circuit, can provide a booster circuit having less voltage loss, larger raising capability and smoother output voltage than those of the conventional circuit.

Figure 5:
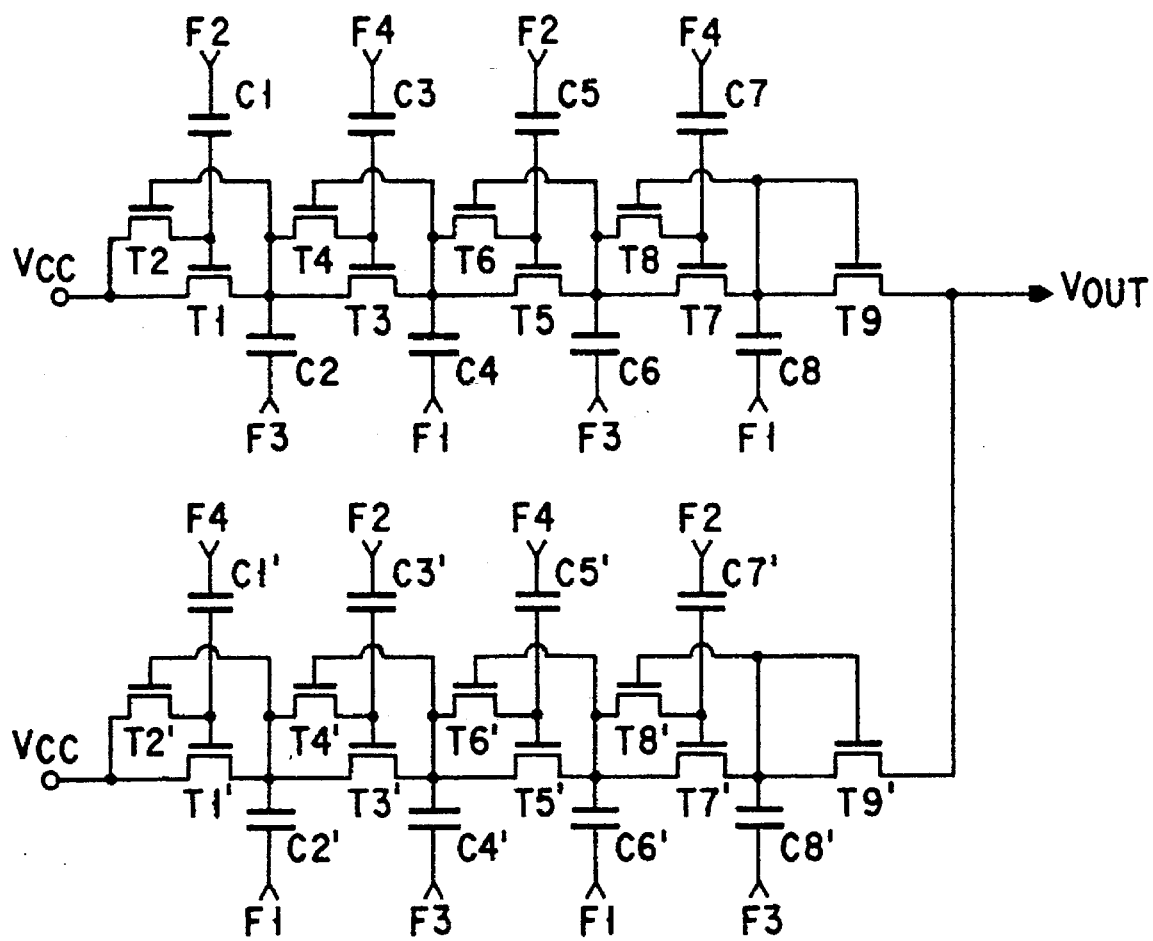
FIG. 5 illustrates a booster circuit according to the third embodiment of the present invention.

FIG. 5 shows a booster circuit according to the third embodiment of the present invention. Gates of the final stage transistors T9 and T9' are connected to their own drains and gates of the transistors T8 and T8', respectively. Although voltage rise efficiency of this circuit is lower than that of the circuit of FIG. 3, output pulsating flow components are less than those of the conventional circuit.

The reason is as follows. As mentioned above, while voltage rises once per cycle in the conventional booster circuit, voltage rises twice in one cycle in the circuit of the present invention. In the present invention, therefore, the first voltage rise and the consequent voltage drop are small, thereby providing output voltage with a less variation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A booster circuit having a first booster circuit section and a second booster circuit section which have the same structure, each of the first and second booster circuit sections comprising:

a plurality of first MOS transistors, said first MOS transistors each having a gate terminal and two current terminals and connected to one another in series;

a plurality of second MOS transistors, said second MOS transistors each having a gate terminal and two current terminals, first one of said current terminals of each second MOS transistor connected to one of the current terminals of the first MOS transistor, second one of said current terminals of each second MOS transistor connected to the gate of the first MOS transistor, said gate terminal, excluding a case of a gate terminal of a second MOS transistor in a final stage, connected to the second one of the current terminals of the first MOS transistor, said gate terminal of the second MOS transistor in a final stage connected to a final node between first MOS transistors of another booster circuit section;

a plurality of first capacitors each having one terminal connected to the gate of each first MOS transistor; and a plurality of second capacitors each having one terminal connected to a node between said first MOS transistors, wherein clock pulses are inputted to second terminals of said first and second capacitors, the second terminals of the first and second capacitors of the first booster circuit section and the second terminals of the first and second capacitors of the second booster circuit section being terminals which correspond to each other and which are supplied with clock pulses opposite each other in phase.

2. A booster circuit having a first booster circuit section and a second booster circuit section which have the same structure, each of the first and second booster circuit sections comprising:

a first group of transistors including a plurality of first MOS transistors, said first MOS transistors each having a gate terminal and two current terminals and connected to one another in series;

a second group of transistors including a plurality of second MOS transistors which are the same in number as the first group of MOS transistors, said second MOS transistors each having a gate terminal and two current terminals, first one of said current terminals of each second MOS transistor connected to one of the current terminals of the first MOS transistor, second one of said current terminals of said second MOS transistor connected to the gate of the first MOS transistor, said gate terminal, excluding a case of a gate terminal of a second MOS transistor in a final stage, connected to the second one of the current terminals of the first MOS transistor, said gate terminal of the second MOS transistor in a final stage connected to a final node between first MOS transistors of another booster circuit section;

a first group of capacitors including first capacitors, which are the same in number as the first MOS transistors, said first capacitors each having oneterminal connected to the gate of each first MOS transistor; and a second group of capacitors including second capacitors each having one terminal connected to a node between said first MOS transistors, wherein clock pulses are inputted to second terminals of said first and second capacitors, the second terminals of the first and second capacitors of the first booster circuit section and the second terminals of the first and second capacitors of the second booster circuit section being terminals which correspond to each other and which are supplied with clock pulses opposite each other in phase.

3. A booster circuit comprising:

(a) first and second circuit sections each having a voltage input section and a voltage output section, the first and second circuit sections each comprising:

a booster block having a plurality of booster units each having an input terminal, an output terminal and a control input, the booster units being arranged in series between the voltage input section and the voltage output section by connecting the input terminal and the output terminal between adjacent booster units; and an output switch block arranged between and output terminal of a final-stage booster unit of said booster block, and the voltage output section; and (b) a voltage output node for connecting the voltage output sections of said first and second circuit sections in common each other, wherein the output switch block comprises:

(i) a first transistor having two current terminals connected to the output terminal of the final-stage booster unit and to the voltage output section, respectively, and a gate terminal;

(ii) a second transistor having two current terminals connected to the gate terminal of said first transistor and to the output terminal of the final-stage booster unit, respectively, and a gate terminal; and (iii) a first capacitor having a first terminal connected to the gate terminal of the first transistor, and a second terminal serving as an input terminal of a clock pulse, and wherein clock pulses inputted to the first and second output switch blocks of the first and second circuit sections have phases opposite each other, and a gate electrode of the second transistor of one of the output switch blocks is connected to the output terminal of the final-stage booster unit of the other output switch block.

4. A booster circuit according to claim 3, wherein the first and second circuit sections comprise an equal number of booster units, and the clock pulses having phases opposite each other are respectively inputted to the control inputs of the corresponding booster units between the first and second circuit sections.

5. A booster circuit according to claim 3, wherein each of the booster units comprise:

a third transistor having two current terminals connected to the input terminal and the output terminal, respectively, and a gate terminal;

a fourth transistor having two current terminals connected to the gate terminal of said third transistor and the input terminal, respectively, and a gate terminal connected to the output terminal;

a second capacitor having a first terminal connected to the gate terminal of the third transistor and a second terminal serving as an input terminal of a first clock pulse; and a third capacitor having a first terminal connected to the gate terminal of the fourth transistor and a second terminal serving as an input terminal of a second clock pulse.

6. A booster circuit according to claim 5, wherein the third and fourth transistors are MOS transistors selected from a group consisting of an N-MOSFET and a P-MOSFET.

7. A booster circuit according to claim 3, wherein the first and second transistors are MOS transistors selected from a group consisting of an N-MOSFET and a P-MOSFET.

8. A booster circuit according to claim 5, wherein the clock pulse inputted to each of the output switch blocks is the first clock pulse.

* * * * *

UNITED STATES PATENT AND TRADEMARK OFFICE
CERTIFICATE OF CORRECTION

PATENT NO.   : 5,644,534
DATED        : July 1, 1997
INVENTOR(S)  : Kouta Soejima It is certified that error appears in the above-identified patent and that said Letters Patent is hereby corrected as shown below:

On the title page, item [73] Assignee, should read --NKK Corporation, Tokyo, Japan and Macronix International Co., Ltd., Hsin-chu, Taiwan--.

Signed and Sealed this

Second Day of June, 1998

*Attest:*

BRUCE LEHMAN

*Attesting Officer*      *Commissioner of Patents and Trademarks*